(12) United States Patent
Hotellier et al.

(10) Patent No.: US 8,138,012 B2
(45) Date of Patent: Mar. 20, 2012

(54) PRODUCTION OF AN IMPROVED COLOR FILTER ON A MICROELECTRONIC IMAGING DEVICE COMPRISING A CAVITY

(75) Inventors: Nicolas Hotellier, Grenoble (FR); Cyril Fellous, Echirolles (FR); Christophe Cowache, Crolles (FR); Yannick Sanchez, St Nazaire les Eymes (FR)

(73) Assignee: STMicroelectronics SA, Montrouge (FR)

( * ) Notice: Subject to any disclaimer, the term of this patent is extended or adjusted under 35 U.S.C. 154(b) by 1320 days.

(21) Appl. No.: 11/760,180

(22) Filed: Jun. 8, 2007

(65) Prior Publication Data
US 2007/0287217 A1  Dec. 13, 2007

(30) Foreign Application Priority Data
Jun. 8, 2006  (FR) ....................... 06 52068

(51) Int. Cl.
*H01L 21/00* (2006.01)
(52) U.S. Cl. .......................................... 438/70
(58) Field of Classification Search ............ 438/70
See application file for complete search history.

(56) References Cited

U.S. PATENT DOCUMENTS

| | | | |
|---|---|---|---|
| 6,252,218 B1 * | 6/2001 | Chou | 250/208.1 |
| 6,297,071 B1 | 10/2001 | Wake | 438/70 |
| 2005/0012166 A1 | 1/2005 | Choi | 257/414 |
| 2005/0117039 A1 | 6/2005 | Tatani | 348/272 |
| 2006/0011813 A1 | 1/2006 | Park et al. | 250/208.1 |
| 2006/0145207 A1 | 7/2006 | Kim | 250/208.1 |

FOREIGN PATENT DOCUMENTS

| | | |
|---|---|---|
| JP | 07050401 | 2/1995 |
| JP | 11-330444 | * 11/1999 |
| JP | 2000036587 | 2/2000 |

OTHER PUBLICATIONS

English translation of JP 11-330444(Nov. 30, 1999).*

* cited by examiner

*Primary Examiner* — Cynthia Kelly
*Assistant Examiner* — Anna Verderame
(74) *Attorney, Agent, or Firm* — Allen, Dyer, Doppelt, Milbrath & Gilchrist, P.A.

(57) ABSTRACT

A microelectronic device includes a color filter equipped with a plurality of filtering elements, including several filtering elements. The device includes at least one first zone located inside a cavity and includes a first group of filtering elements having a first critical dimension, and at least one second zone at the periphery of the cavity, including a second group of filtering elements having a second critical dimension that is different from the first critical dimension.

15 Claims, 6 Drawing Sheets

PRODUCTION OF AN IMPROVED COLOR FILTER ON A MICROELECTRONIC IMAGING DEVICE COMPRISING A CAVITY

FIELD OF THE INVENTION

The invention relates to the field of microelectronics, and, more particularly, to that of microelectronic devices, such as imaging devices or image sensors, equipped with photoelectric detector components provided to produce a photoelectric current by absorption of incidental visible luminous radiation.

BACKGROUND OF THE INVENTION

A microelectronic imaging device or image sensor is generally formed by a matrix of pixels and of at least one electronic control circuit formed around the matrix. Each pixel comprises at least one photoelectric detector, for example, a photodiode or a phototransistor, provided to convert the energy of the incidental photons on the pixel into electron-hole pairs. The matrix of pixels also called the "active matrix" may be especially covered with an insulating layer and a trichromatic or three color filter formed on this insulating layer. The color filter is formed by colored filtering elements, respectively capable of filtering a range of wavelengths from the visible luminous spectrum, and may be for example of the RGB type (Red Green Blue) or for example of the CMY type (Cyan Magenta Yellow). The filtering elements may be arranged according to a Bayer pattern. The filtering elements may also be formed by blocks based on a polymer or a photosensitive resin, and made using at least one photolithographic method, during which the resin or the polymer is exposed, for example, using UV radiation through a mask. After exposure, the resin is developed. During this development, a large quantity of resin is removed from zones of the microelectronic device that are not located opposite the active matrix, with respect to a quantity of resin removed from the non active zones of the microelectronic device that are not located opposite the active matrix. This can lead to an incorrect definition of the filtering elements located at the periphery of the matrix.

To address this problem, a known method includes forming a color filter equipped with dummy filtering elements at the periphery, that are not located above and opposite the active matrix.

One specific embodiment of a microelectronic imaging device or image sensor, provides for the production of an active matrix equipped with a given number of metallic interconnection levels, for example 2 interconnection levels, and an electronic control circuit equipped with a greater number of metallic interconnection levels than the given number, for example, 4 interconnection levels. In this specific embodiment, the insulating layer that covers the active matrix and the electronic control circuit is capable of forming a cavity whose bottom is located above and opposite the active matrix. In this case especially, the formation of the color filter, and, in particular, the photolithographic method which permits the blocks of resin to be defined raises a problem in that it is difficult to obtain resin patterns with correct definition both inside and outside of the cavity at the same time. Furthermore, if one favors obtaining resin patterns with the correct definition inside of the cavity, a phenomenon of the resin outside of the cavity losing adhesion may occur.

SUMMARY OF THE INVENTION

One purpose of this invention is to provide a fabrication method using thin layers of a color filter on a microelectronic device, for example, such as an imaging device or image sensor, that addresses the disadvantages mentioned above.

The invention relates firstly to a fabrication method in thin layers of a color filter comprising: the formation on a microelectronic device of a plurality of filtering elements of which there are several filtering elements of a first type, based at least on a first material and respectively capable of filtering a first range of wavelengths from the visible luminous spectrum. The filter may also include several filtering elements of a second type based at least on a second material and respectively capable of filtering a second range of wavelengths from the visible luminous spectrum, and several filtering elements of a third type, based at least on a third material and respectively capable of filtering a third range of wavelengths from the visible luminous spectrum. The plurality of filtering elements comprising at least one first group of filtering elements may have a first critical dimension or one critical dimension belonging to a first range of critical dimensions formed in a first region of the microelectronic device, and at least one second group of filtering elements with a second critical dimension that is different to the first critical dimension or one critical dimension belonging to a second range of critical dimensions different from the critical dimensions of the first range, and formed in a second region of the microelectronic device outside of the first region.

Throughout this description, by "critical dimension" it is to be understood the minimum dimension of a geometric pattern produced in a thin layer, excluding the dimension defined by the thickness of this thin layer.

The first region may be the bottom of a cavity, for example formed by a layer of the microelectronic device. The second region may, for example, form a closed contour around the cavity.

The second critical dimension may be greater than the first critical dimension, or the critical dimensions of the second range of critical dimensions may be greater than the critical dimensions of the first range of critical dimensions.

In one possible embodiment of the method, a zone based on the first material or the second material or the third material, may be produced between the first group and the second group. This may allow the loss of adhesion phenomena of the filtering elements close to the vertical walls of the cavity to be limited.

In one variant, a zone based on a transparent material that is different from the first, second and third materials, may be produced between the first group and the second group. This may also allow the loss of adhesion phenomena of the filtering elements close to the vertical walls of the cavity to be limited.

The filtering elements may be arranged in the form of a Bayer pattern and/or a pattern comprising twice as many filtering elements of the second type than filtering elements of the first type on the one hand, and than filtering elements of the third type on the other hand. The first group of filtering elements located in the cavity may be formed opposite one or several photoelectric detectors of the microelectronic device.

In one possible embodiment, the method may further comprise the formation of a plurality of microlenses opposite the filtering elements of the first group. In one possibility, microlenses that may be dummies may be produced opposite the filtering elements of the second group.

Another aspect relates to a microelectronic device comprising a color filter produced in thin layers and equipped with a plurality of filtering elements of which there are several filtering elements of a first type, based at least on a first material and respectively capable of filtering a first range of wavelengths from the visible luminous spectrum. There may also be several filtering elements of a second type, based at least on a second material, and respectively capable of filtering a second range of wavelengths from the visible luminous spectrum; and several filtering elements of a third type, based at least on a third material, respectively capable of filtering a third range of wavelengths from the visible luminous spectrum. The microelectronic device may comprise at least one first region comprising a first group of filtering elements with a first critical dimension or a critical dimension belonging to a first range of critical dimensions; and at least one second region, at the periphery of the first region, comprising a second group of filtering elements with a second critical dimension different from the first critical dimension or belonging to a second range of critical dimensions different from the critical dimensions of the first range of critical dimensions.

The first region may be the bottom of a cavity for example formed by a layer of the microelectronic device. The second region may, for example, form a closed contour around said cavity.

The second critical dimension may be greater than the first critical dimension or critical dimensions of the second range of critical dimensions, may be greater than the dimensions of the first range of critical dimensions.

In one possibility, the first group and the second group may be separated by a zone based on the first material or the second material or the third material. In one variant, the first group and the second group may be separated by a zone based on a material that is different from the first, second and third materials. In one possible embodiment, the filtering elements may be arranged in a Bayer pattern.

The filtering elements located inside the cavity may be opposite respectively at least one photoelectric detector, such as a photodiode or a phototransistor. The microelectronic device may further comprise a plurality of microlenses opposite the filtering elements of the first group.

BRIEF DESCRIPTION OF THE DRAWINGS

This invention will be better understood upon reading the description of examples of embodiments provided, purely by way of illustration and in no way restrictively, in reference to the appended drawings in which.

Identical, similar or equivalent parts of the various figures bear the same numerical references so as to facilitate the passage from one figure to another. The various parts shown in the figures are not necessarily shown to a uniform scale, in order to make them easier to read.

DETAILED DESCRIPTION OF THE PREFERRED EMBODIMENTS

Figure 1:
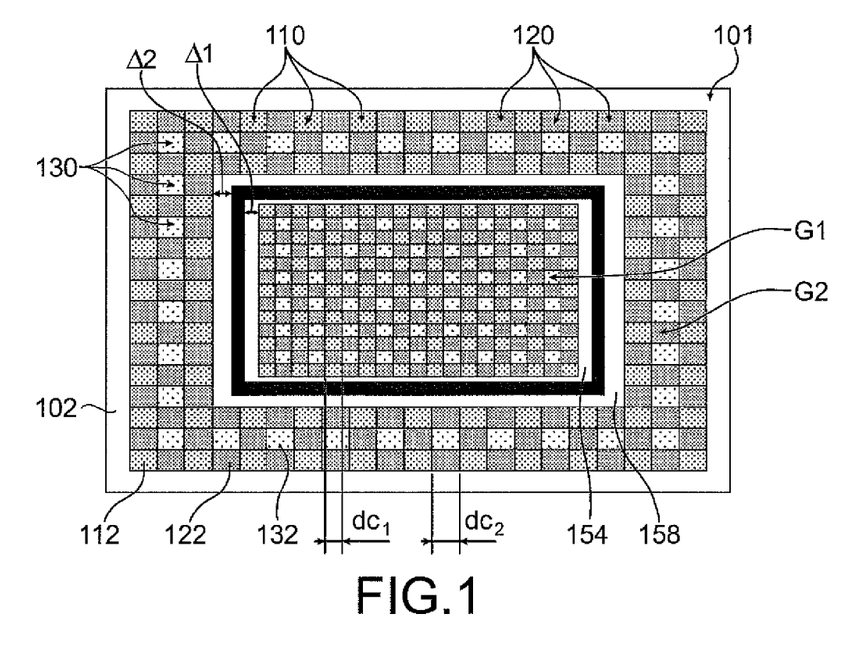
FIGS. 1 to 4 illustrate examples of microelectronic imaging devices equipped with a color filter according to the invention, with a top view.
Figure 2:
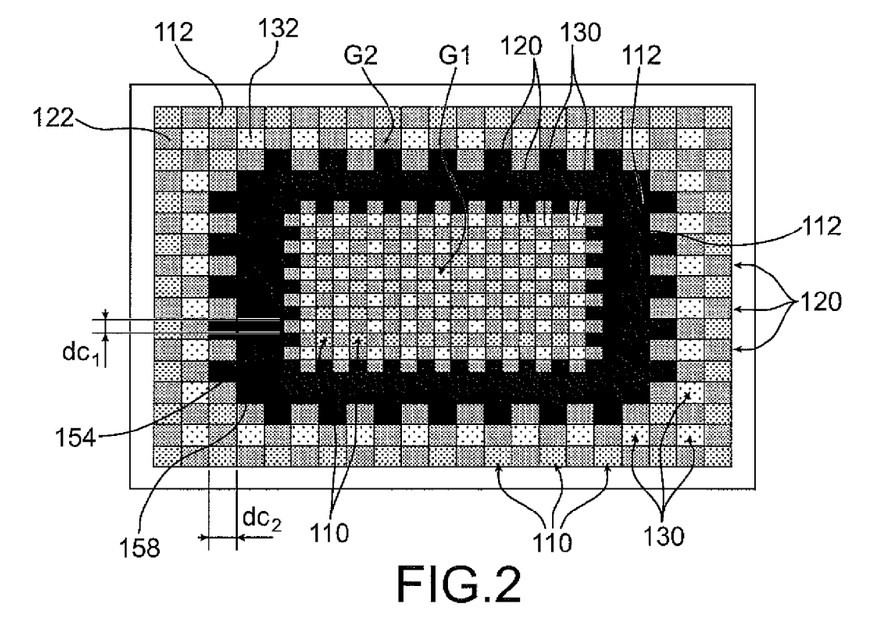
Figure 5A:
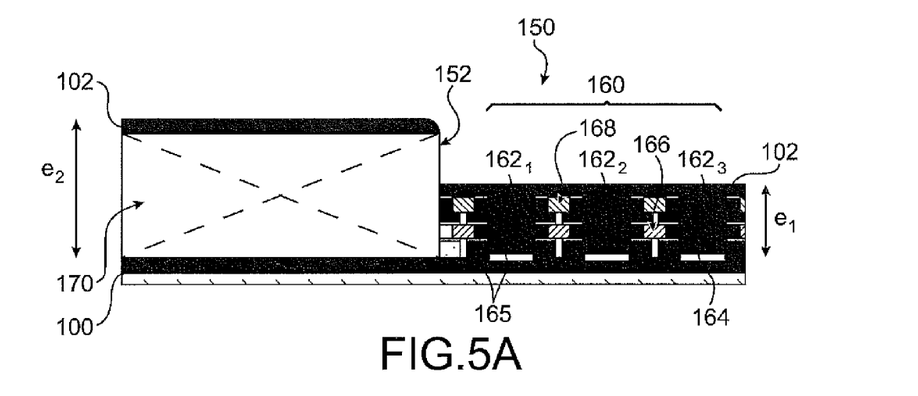
FIGS. 5A to 5H, illustrate a method of the invention of the production of a microelectronic device equipped with a color filter.
Figure 5B:
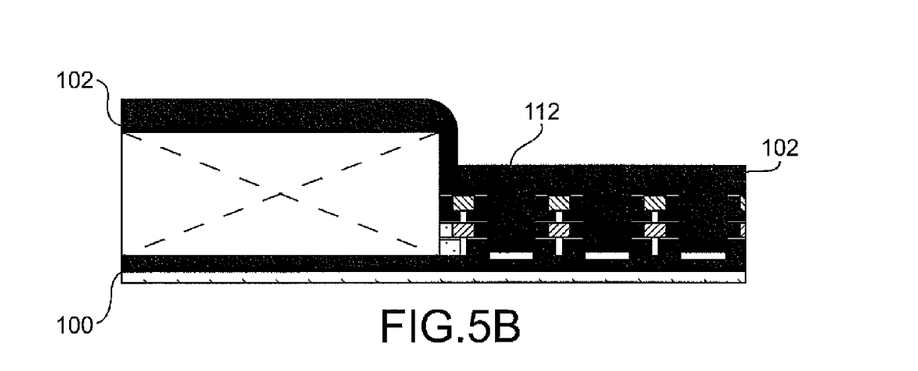
Figure 5C:
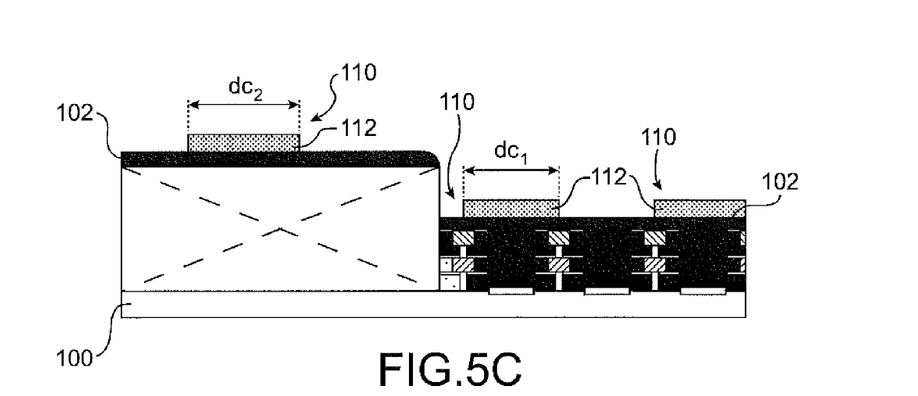
Figure 5D:
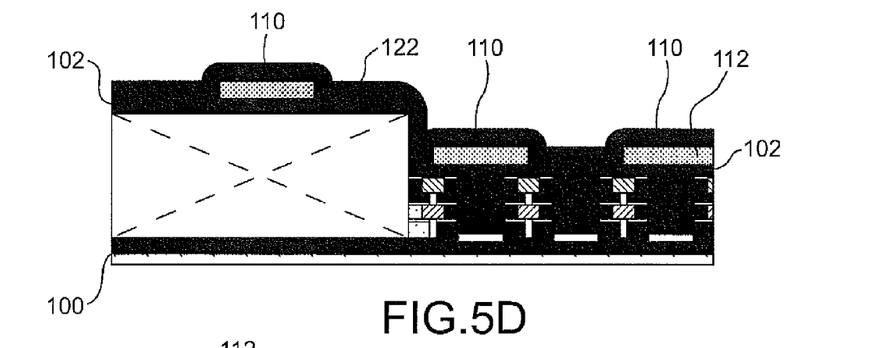
Figure 5E:
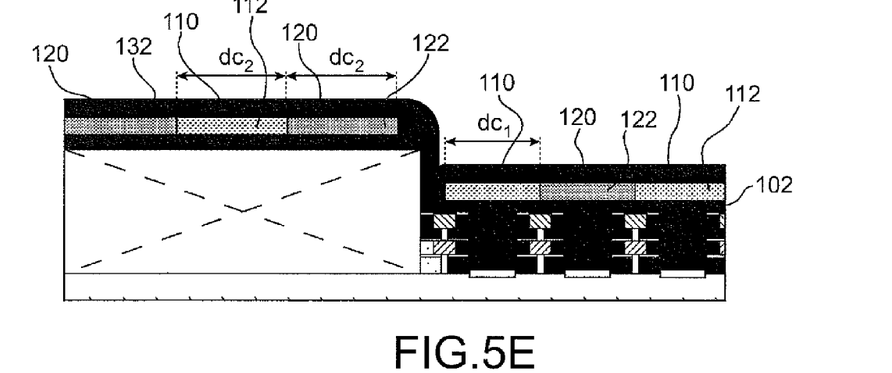
Figure 5F:
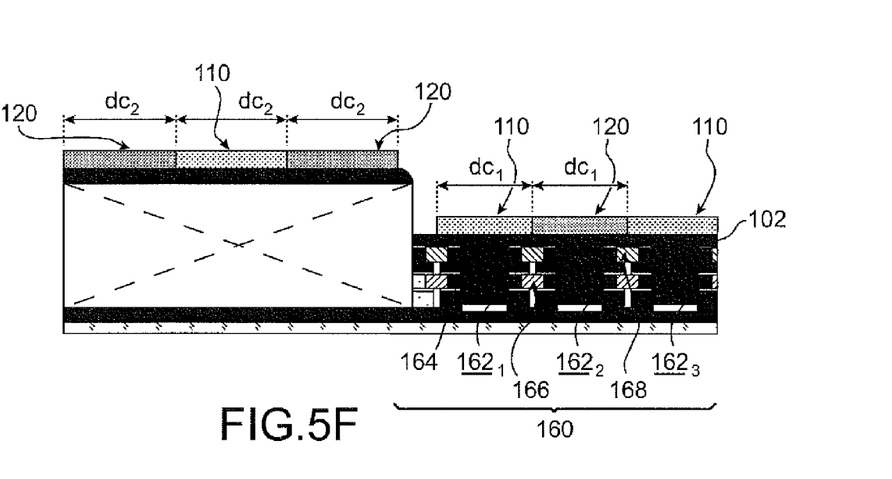
Figure 5G:
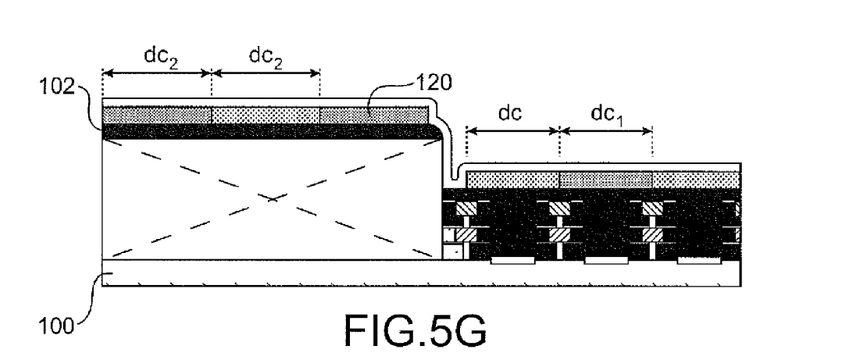
Figure 5H:
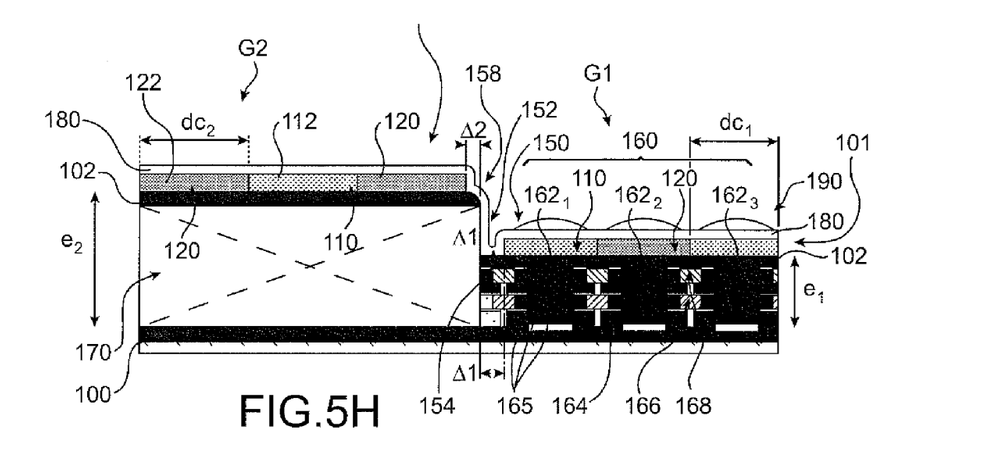

A microelectronic device equipped with a color filter made in thin layers, is illustrated in a top view in FIG. 1 and in a cross sectional view in FIG. 5H. This microelectronic device may be, for example, an imaging device or image sensor. The color filter 101 comprises a plurality of filtering elements formed on a transparent insulating layer 102, for example, $SiO_2$ and/or $Si_3N_4$ based. The filter 101 comprises filtering elements of a first type 110, and capable of filtering a first range of wavelengths of the visible luminous spectrum, for example, wavelengths greater than 550 nm. The filtering elements of the first type 110 may be, for example, in the form of blocks based on a first material 112, such as a polymer or a resin, colored or equipped with colored pigments, for example, metallic pigments. The first material 112 may be, for example, a blue resin or comprising blue pigments. The filter 101 also comprises filtering elements of a second type 120, capable of filtering a second range of wavelengths from the visible luminous spectrum, different from the first range, and, for example, wavelengths of less than 450 nanometers and greater than 650 nanometers. The filtering elements of the second type 120 may be, for example, in the form of blocks based on a second material 122, such as a colored or pigmented resin. The second material 122 may be, for example, a green resin or one that comprises green pigments. The filter 101 also comprises filtering elements of a third type 130, respectively capable of filtering a third range of wavelengths from the visible luminous spectrum, different from the first range and the second range, and, for example, wavelengths of less than 575 nanometers. The filtering elements of the third type 130 may be, for example, in the form of blocks based on a third material 132, such as a colored or pigmented resin. The third material 132 may be, for example, a red resin or may comprise red pigments. The filtering elements 110, 120, 130 may be in the form of blocks of a thickness (measured along an axis that is orthogonal to the plane of FIG. 4), for example, of around 1 micrometer, or, for example, between 0.5 and 2 micrometers. The filtering elements may also have a matrix layout in a pattern, for example, of the Bayer type. In one possibility, the filter 101 may be used with twice as many filtering elements of the second type 120 as filtering elements of the third type 130 or filtering elements of the first type 110.

The imaging device comprises in a first zone, an optoelectronic circuit 160 also called "active matrix" covered by the insulating layer 102 and formed by a plurality of pixels or optoelectronic cells $162_1$, $162_2$, $162_3$, ..., $162_n$, arranged in a matrix and respectively comprising at least one photoelectric detector 164, such as, a phototransistor or a photodiode as well as interconnections. The optoelectronic circuit is formed on a substrate 100, for example, a semi-conductor, and comprises a given number k (where k is an integer) of metallic interconnection levels, for example, two metallic interconnection levels 166, 168. The active matrix may be covered by an insulating thickness $e_1$, for example, of around 1 micrometer from the insulating layer 102. In the first zone is located a first group G1 of filtering elements having a first critical dimension $dc_1$, for example, of between 0.5 and 3 μm, or respectively with a critical dimension belonging to a first range of critical dimensions, formed on the insulating layer 102 above and opposite the active matrix (FIGS. 1 and 5H)

In a second zone of the imaging device, outside and around the first zone, there is a second group G2 of filtering elements having a second critical dimension $dc_2$ or respectively having a critical dimension belonging to a second range of critical dimensions different from the critical dimensions of the first range. The second critical dimension $dc_2$ may be provided to be greater than the first critical dimension $dc_1$. The second critical dimension $dc_2$ may be, for example, between 0.5 and 10 μm. The critical dimensions of the second range may be provided to be greater than the critical dimensions of the first range. The filtering elements of the second group G2 are called dummies and are not located above the optoelectronic circuit or opposite the optoelectronic cells. The dummy filtering elements may be formed above and opposite part of another electronic circuit (located in a block reference number 170 in FIG. 8H) of the imaging device, for example, part of a logic control circuit of the matrix. In one specific embodiment, such a logic circuit 170 may be made with p metallic interconnection levels (where p is a integer such that p>k), for example 4 metallic interconnection levels (not shown) and covered by a thickness $e_2$, for example, of around 1 micrometer from the insulating layer 102.

The topography of the circuits 160, 170 of the imaging device may be such that the insulating layer 102 which covers these circuits forms a cavity 150, for example, rectangular in shape or of a contour that creates a rectangle, and at the bottom of which are the filtering elements of the first group G1. The cavity 150 may have a depth for example of around 1 micrometer.

The dummy filtering elements of the second group G2 are located outside of the cavity 150, and may form a rectangular strip around the cavity 150.

A space 154 may be provided between the sides or vertical walls 152 of the cavity, and the first group of filtering elements located at the bottom of the cavity 150. The sides or vertical walls 152 of the cavity 150 on the one hand, and the first group of filtering elements on the other hand, may be separated by a distance Δ1 of between, for example, 0 and 150 μm. In one possible embodiment, this space 154 may be filled by a given material that is different from the first, second and third materials 112, 122, 132. Another space 158 may also be provided between the edges of the cavity 150, and the second group of filtering elements located outside of the cavity 150. The edges of the cavity 150 on the one hand, and the second group G2 of filtering elements on the other hand, may be separated by a distance Δ2 of between, for example, 0 and 150 μm. In one possible embodiment, this other space 158 may be filled by a material that is different from the first, second and third materials 112, 122, 132. The first group G1 and the second group G2 may be thus be separated by a zone based on a material that is different from the first, second and third materials 112, 122, 132.

Microlenses 190 based on a transparent resin may be formed above and opposite the filtering elements of the first group G1, for example, such that each filtering element is opposite a microlens. In one possibility (not shown), dummy microlenses 190 may also be formed above and opposite the filtering elements of the first group G2.

An intermediate layer based on a transparent material 180, for example, a photosensitive transparent resin or a polymer may be provided between the filtering elements 110, 120, 130, and the microlenses 190. The intermediate layer based on a given transparent material 180 may make it possible to compensate any differences in height between the filtering elements based on the first material 112, the filtering elements based on the second material 122, and the filtering elements based on the third material 132, and to make the surface on which the microlenses rest as flat as possible. The spaces 154 and 158 may be filled at least partially by the transparent material 180 (FIG. 5H).

FIGS. 2 and 6B, 3 and 7, 4 and 8, illustrate variants of the microelectronic device. For a variant illustrated in FIGS. 2 and 6B, the space 154 between the sides or vertical walls 152 of the cavity, and the first group G1 of filtering elements located at the bottom of the cavity 150, is filled by the first material 112. The other space 158 between the edges of the cavity 150, and the second group of filtering elements located outside of the cavity 150 may also be filled by the first material 112.

Figures 3, 4:
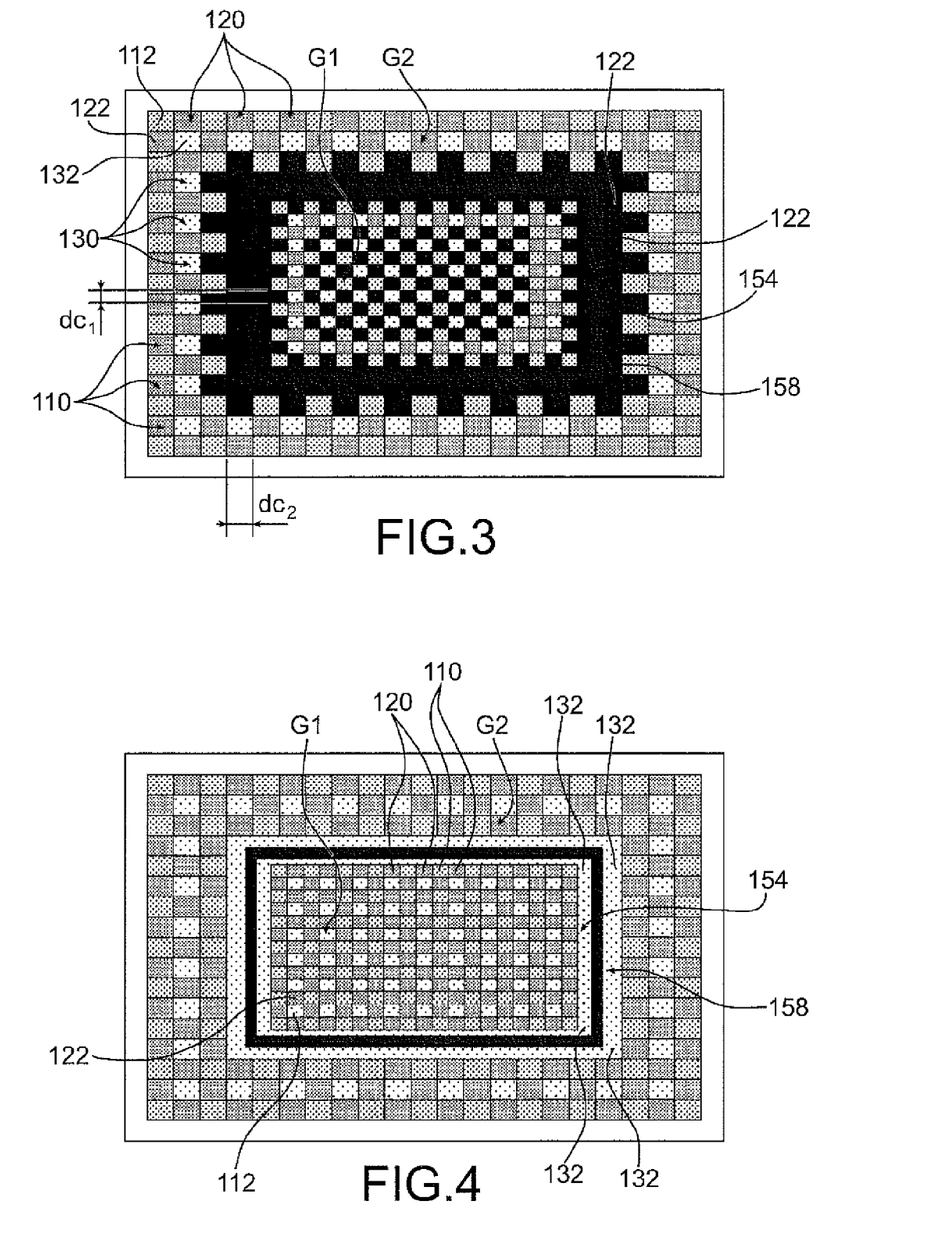
Figure 7:
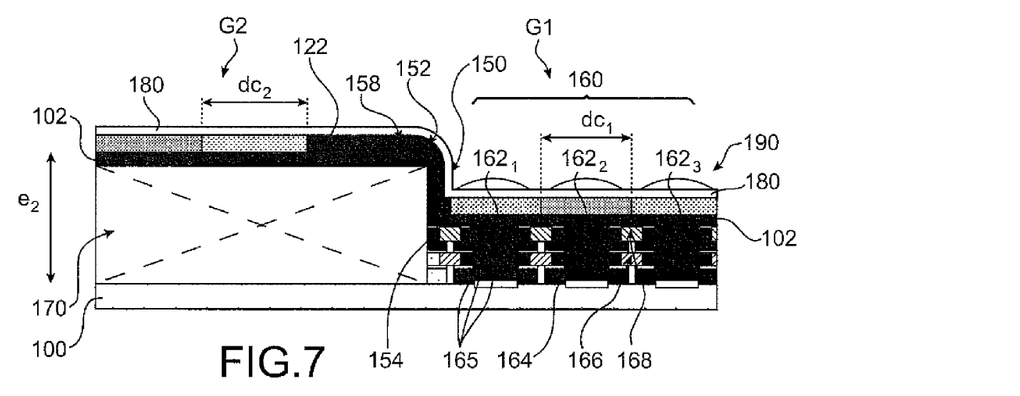
FIGS. 7 to 8, illustrate variants of microelectronic devices of the invention equipped with a color filter.

In one variant that is illustrated in FIGS. 3 and 7, the space 154 between the sides or vertical walls 152 of the cavity, and the first group G1 of filtering elements located at the bottom of the cavity 150, is filled by the second material 122. The other space 158 between the edges of the cavity 150, and the second group of filtering elements located outside of the cavity 150 may also be filled with the second material 122.

Figure 8:
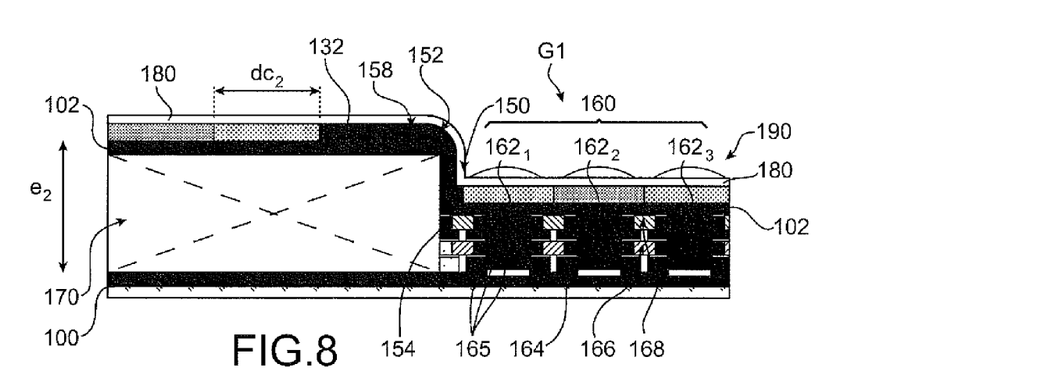

For one variant illustrated in FIGS. 4 and 8, the space 154 between the sides or vertical walls 152 of the cavity, and the first group G1 of filtering elements located at the bottom of the cavity 150, is filled with the third material 132. The other space 158 between the edges of the cavity 150, and the second group of filtering elements located outside of the cavity 150 may also be filled with the third material 132.

One example of an embodiment of the fabrication method in thin layers of a microelectronic device equipped with a color filter, such as, that previously described in relation to FIGS. 1 and 5H, will now be given in relation to FIGS. 5A-5H. The filter may be made, for example, on a microelectronic device, such as an imaging device being produced and of the same type as that previously described, once the active matrix 160, and the electronic circuit 170 have been produced on the substrate 100 and the insulating layer 102 has been deposited on this active matrix 160, and on the electronic circuit 170. As described above, due to the layout of these circuits 160, 170, the insulating layer 102 which covers these circuits, is capable of forming a cavity 150, the bottom of which is located opposite the active matrix 160. The cavity 150 comprises sides or vertical walls 152 of a height for example of around 1 micrometer (FIG. 5A).

On the insulating layer 102, for example, by depositing, a layer is formed based on the first material 112, and of a thickness of between, for example, 0.5 micrometers and 2 micrometers or, for example, of around 1 micrometer (FIG. 5B).

Subsequently, the layer of first material 112 is insulated using for example UV radiation through a first mask. The first mask comprises a plurality of first patterns of a given critical dimension and a plurality of second patterns, similar to the first patterns, but with a different critical dimension to the given critical dimension. Then the layer of first material 112 is developed, for example so as to remove the unexposed parts of this layer.

After the development, blocks based on the first material 112 and with a first critical dimension $dc_1$ or a dimension belonging to a first range of critical dimensions are made at the bottom of the cavity 150, while around the cavity 150, other blocks based on the first material 112 and with a second critical dimension $dc_2$ or with a critical dimension belonging to a second range of critical dimensions are formed (FIG. 5C).

On the insulating layer 102 and the blocks based on the first material 112, a layer based on the second material 122 is formed with a thickness of between for example 0.5 micrometers and 2 micrometers or, for example, of around 1 micrometer (FIG. 5D) for example, by deposition.

Subsequently, the layer of second material 122 is exposed using, for example, UV radiation and through a second mask comprising patterns with a given critical dimension and other similar patterns, but with a different critical dimension. The layer of second material 122 is then developed. After development, blocks based on the second material 122 and a first critical dimension $dc_1$ or with a dimension belonging to a first range of critical dimensions are produced at the bottom of the cavity 150 next to the blocks based on the first material 112, while other blocks based on the second material 122 and with a second critical dimension $dc_2$ or with a dimension belonging to a second range of critical dimensions are produced around the cavity 150 next to the blocks based on the first material 112.

On the insulating layer 102 and the blocks based on the first material 112, the blocks based on the second material 122, a layer is then formed based on the third material 132 with a thickness of between for example 0.5 micrometers and 2 micrometers or for example around 1 micrometer (FIG. 5E).

Subsequently, the layer of third material 132 is exposed using for example UV radiation and through a third mask comprising patterns with a given critical dimension and other similar patterns, but with a different critical dimension. Then, the layer of third material 132 is developed. After development (FIG. 5F), blocks based on the third material are produced at the bottom of the cavity 150, and around the cavity 150. The blocks of third material 132 located at the bottom of the cavity have a critical dimension $dc_1$ while the blocks of third material 132 located around the cavity have a critical dimension $dc_2$ (the blocks based on the third material 132 are not shown in the cross sectional view of FIG. 5F).

In this example of the method, the first mask, the second mask, and the third mask comprise patterns arranged such that after the photolithography and development steps previously described, the first material 112, the second material 122, and the third material 132, are removed from a zone located against the sides or vertical walls 152 of the cavity 150, so as to form a space 154 between the filtering elements located inside the cavity 150 on the one hand and the walls 152, and from another zone located at the level of the outside edges of the cavity 150 on the other hand, so as to form another space 158 between the filtering elements located outside of the cavity 150 on the one hand and the edges of the cavity 150 on the other hand.

Subsequently, the layer based on the transparent material 180 is deposited at a thickness of between for example 0.1 micrometers and 2 micrometers, on the filtering elements 110, 120, 130 and so as to fill at least partially the spaces 158 and 154 (FIG. 5G).

Subsequently, microlenses 190 are formed on the filtering elements located inside the cavity 150, by depositing, for example, a layer of resin, then insulating this layer of resin through a mask (not shown) and developing, so as to form a block of resin opposite each of the filtering elements located inside the cavity 150. The resin is then heat treated so as to provide the resin blocks a semi-spherical form (FIG. 5H). In one possibility (not shown) dummy microlenses may be formed opposite the filtering elements located outside of the cavity 150.

The order in which the elements 110, 120, 130, are produced or in which the layers based on materials 112, 122, 132 are respectively deposited may be different from that just described. In one variant, it is possible, for example, to form first the elements 122 based on the second material, then the elements 112 based on the first material 110, then the elements 132 based on the third material 130.

Figure 6A:
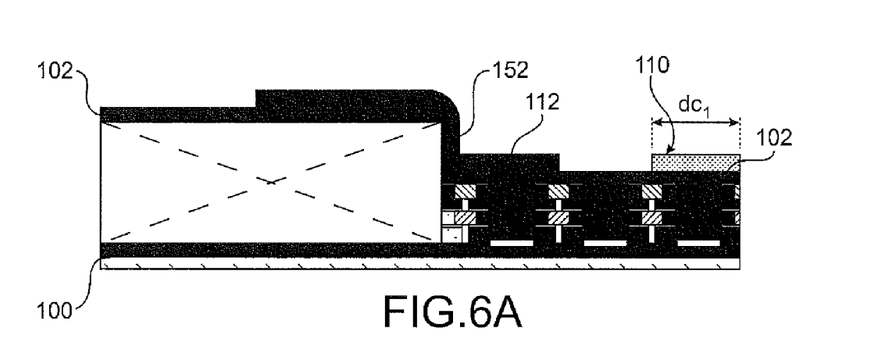
FIGS. 6A to 6B, illustrate one variant of the fabrication method of the invention of a microelectronic device equipped with a color filter.
Figure 6B:
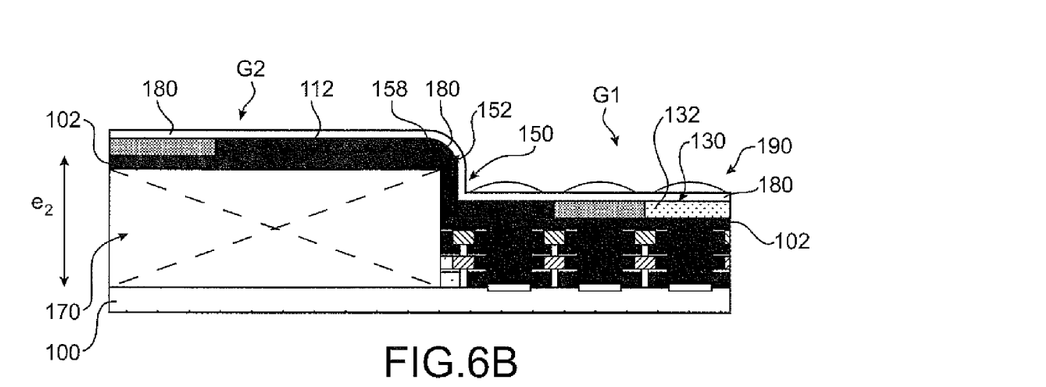

In one variant of the example of the method previously described, the patterns of the first mask may be provided such that following the photolithographic step of the layer of first material 112 produced using this first mask, the first material 110 is kept in a zone located against the sides or vertical walls 152 of the cavity 150, and in another zone located at the level of the outside edges of the cavity 150 (FIG. 6A). Subsequently, the same steps are carried out as in the example of the method previously described in relation to FIGS. 5D and 5H. At the end of this variant of the method, the first group of filtering elements located at the bottom of the cavity 150 is separated from the second group of filtering elements formed around the cavity 150 by a zone based on the first material 112 (FIG. 6B).

In another variant of the method, the zone separating the first group of filtering elements from the second group of filtering elements, may be formed based on the second material 122 (FIG. 7). In another variant of the method, the zone separating the first group of filtering elements from the second group of filtering elements, may be formed based on the third material 132 (FIG. 8).

That which is claimed:

1. A microelectronic device with a multilayer color filter, the microelectronic device comprising:
   a plurality of filtering elements including
      a plurality of first type filtering elements comprising a first material filtering a first range of wavelengths from a visible light spectrum,
      a plurality of second type filtering elements comprising a second material filtering a second range of wavelengths from the visible light spectrum, and
      a plurality of third type filtering elements comprising a third material filtering a third range of wavelengths from the visible light spectrum;
   at least one first group of the filtering elements being inside a cavity and at a first level, and having a first critical dimension belonging to a first range;
   at least one second group of the filtering elements being outside the cavity and at a second level above the first level and having a second critical dimension belonging to a second range.

2. The microelectronic device according to claim 1 wherein the second critical dimension is greater than the first critical dimension.

3. The microelectronic device according to claim 1 wherein the second critical dimension is greater than the first critical dimension; and further comprising a plurality of microlenses opposite at least the filtering elements of said at least one first group.

4. The microelectronic device according to claim 1 further comprising a zone comprising at least one of said first material, said second material, and said third material, said zone separating said at least one first group and said at least one second group.

5. The microelectronic device according to claim 1 further comprising a zone comprising a transparent material different from said first material, said second material, and said third material, said zone separating said at least one first group and said at least one second group.

6. The microelectronic device according to claim 1 wherein said plurality of filtering elements has a Bayer pattern.

7. The microelectronic device according to claim 1 further comprising a plurality of photoelectric detectors opposite said at least one first group of filtering elements located inside said cavity.

8. The microelectronic device according to claim 1 further comprising a plurality of microlenses opposite at least the filtering elements of said at least one first group.

9. A microelectronic device with a multilayer color filter, the microelectronic device comprising:
   a plurality of filtering elements including
      a plurality of first type filtering elements comprising a first material filtering a first range of wavelengths from a visible light spectrum,
      a plurality of second type filtering elements comprising a second material filtering a second range of wavelengths from the visible light spectrum, and a plurality of third type filtering elements comprising a third material filtering a third range of wavelengths from the visible light spectrum;

at least one first group of the filtering elements being inside a cavity and at a first level, and having a first dimension characteristic value;

at least one second group of the filtering elements being outside the cavity and at a second level above the first level and having a second dimension characteristic value.

10. The microelectronic device according to claim 9 wherein the second dimension characteristic value is greater than the first dimension characteristic value.

11. The microelectronic device according to claim 9 wherein the second dimension characteristic value is greater than the first dimension characteristic value; and further comprising a plurality of microlenses opposite at least the filtering elements of said at least one first group.

12. The microelectronic device according to claim 9 further comprising a zone comprising at least one of said first material, said second material, and said third material, said zone separating said at least one first group and said at least one second group.

13. The microelectronic device according to claim 9 further comprising a zone comprising a transparent material different from said first material, said second material, and said third material, said zone separating said at least one first group and said at least one second group.

14. The microelectronic device according to claim 9 wherein said plurality of filtering elements has a Bayer pattern.

15. The microelectronic device according to claim 9 further comprising a plurality of photoelectric detectors opposite said at least one first group of filtering elements located inside said cavity.

* * * * *